(12) United States Patent
Yoon (10) Patent No.: US 9,655,257 B2
(45) Date of Patent: May 16, 2017

(54) MODULE TYPE SAFETY BUS BAR

(75) Inventor: Jong-Chan Yoon, Busan (KR)

(73) Assignee: BMT CO., LTD., Yangsan-si, Gyeongsangnam-Do (KR)

( * ) Notice: Subject to any disclaimer, the term of this patent is extended or adjusted under 35 U.S.C. 154(b) by 34 days.

(21) Appl. No.: 14/357,009

(22) PCT Filed: Aug. 13, 2012

(86) PCT No.: PCT/KR2012/006423
§ 371 (c)(1),
(2), (4) Date: Aug. 5, 2014

(87) PCT Pub. No.: WO2013/069879
PCT Pub. Date: May 16, 2013

(65) Prior Publication Data
US 2015/0043173 A1    Feb. 12, 2015

(30) Foreign Application Priority Data

Nov. 8, 2011    (KR) .......................... 10-2011-0115548

(51) Int. Cl.
| | |
|---|---|
| *H05K 5/00* | (2006.01) |
| *H04B 5/00* | (2006.01) |
| *H05K 5/02* | (2006.01) |
| *H05K 5/03* | (2006.01) |
| *H01R 25/16* | (2006.01) |
| *H05K 7/14* | (2006.01) |

(Continued)

(52) U.S. Cl.
CPC ......... *H05K 5/0065* (2013.01); *H01R 25/162* (2013.01); *H04B 5/0031* (2013.01);
(Continued)

(58) Field of Classification Search
CPC ...... H05K 5/0065; H05K 7/1457; H05K 5/03; H05K 5/0247; H01R 25/162; H01H 71/08;
(Continued)

(56) References Cited

U.S. PATENT DOCUMENTS

| | | | |
|---|---|---|---|
| 5,831,425 A | 11/1998 | Ochiai | |
| 5,847,921 A * | 12/1998 | Kim | ...................... H02B 1/056 |
| | | | 174/149 B |

(Continued)

FOREIGN PATENT DOCUMENTS

| | | |
|---|---|---|
| KR | 20-0402632 | 12/2005 |
| KR | 10-2008-0092718 | 10/2008 |

(Continued)

OTHER PUBLICATIONS

International Search Report for International Application No. PCT/KR2012/006423 dated, Feb. 21, 2013.

*Primary Examiner* — Courtney Smith
*Assistant Examiner* — Sagar Shrestha
(74) *Attorney, Agent, or Firm* — Kile Park Reed & Houtteman PLLC (57) ABSTRACT

Disclosed is a module type safety bus bar including: a vertical coupling portion (20) which is a vertically-extending rectangular parallelepiped insulating block, has an upper end provided with a first combining means, and a middle portion into which a bus bar (30) penetrates to be combined with the vertical coupling portion in the form of a cross, the bus bar (30) connecting terminals of a distributor (A) to a circuit breaker (B); and a horizontal coupling portion (10) which is a horizontally-extending rectangular parallelepiped insulating block and has a second combining means, to be combined with the first combining means, in a middle portion of a lower end thereof. The horizontal coupling portion (10) covers an exposed metallic portion of the bus bar after the terminals of the distributor and circuit breaker are connected to each other so that the bus bar (30) becomes safe.

16 Claims, 8 Drawing Sheets

(51) Int. Cl.
*H01H 71/08* (2006.01)
*H02B 1/056* (2006.01)
*H02B 1/22* (2006.01)

(52) U.S. Cl.
CPC ............ *H05K 5/0247* (2013.01); *H05K 5/03* (2013.01); *H05K 7/1457* (2013.01); *H01H 71/08* (2013.01); *H02B 1/056* (2013.01); *H02B 1/22* (2013.01)

(58) Field of Classification Search
CPC ...... H01H 71/082; H04B 5/0031; H02B 1/20; H02B 1/22; H02B 1/056
USPC ....... 361/611, 624, 637, 639, 648, 729, 775; 174/72 B, 71 B, 88 B, 70 B, 129 B, 174/133 B, 149 B
See application file for complete search history.

(56) References Cited

U.S. PATENT DOCUMENTS

| | | | | |
|---|---|---|---|---|
| 7,012,800 B2* | 3/2006 | Busch | ................... | H01H 89/06 361/605 |
| 2010/0128417 A1* | 5/2010 | Ichinomiya | .......... | H01H 1/5844 361/636 |
| 2010/0259255 A1* | 10/2010 | Hashio | ................. | G01R 15/207 324/244 |
| 2011/0148407 A1* | 6/2011 | Kawaguchi | .......... | G01R 15/207 324/244 |

FOREIGN PATENT DOCUMENTS

| KR | 20-2009-0006691 | * | 7/2009 |
|---|---|---|---|
| KR | 100909284 | | 8/2009 |

\* cited by examiner

MODULE TYPE SAFETY BUS BAR

TECHNICAL FIELD

The present invention relates to a module type safety bus bar including: a vertical coupling portion which is a vertically-extending rectangular parallelepiped insulating block, has an upper end provided with a first combining means and a middle portion into which a bus bar penetrates to be combined with the vertical coupling portion in the form of a cross, in which the bus bar connects a terminal for one phase of power of a distributor and a terminal for one phase of power of a circuit breaker; and a horizontal coupling portion which is a horizontally-extending rectangular parallelepiped insulating block and has a second combining means, combined with the first combining means of the vertical coupling portion, in a middle portion of a lower end thereof. The module type safety bus bar allows an operator to safely connect the terminal of the distributor to the terminal of the circuit breaker because it is safe to hold the vertical coupling portion, and the module type safety bus bar is safe even after the bus bar is connected between the distributor and the circuit breaker because a metallic portion of the bus bar, which is likely to appear on the outside after it is connected between the distributor and the circuit breaker, is covered by the horizontal coupling portion.

BACKGROUND ART

The present invention relates to a bus bar used to connect a terminal box and a circuit breaker to each other.

Generally, a bus bar is a metallic bar with screw holes formed at respective ends and is used to connect a power terminal of a terminal box to a power terminal of a circuit breaker.

In order to insulate the terminals from each other, an elevated insulating block is disposed between the terminal box and the circuit breaker. Since conventional bus bars are made of metal, it is inconvenient to install bus bars because conventional bus bars have no safe portion to hold.

Furthermore, since a terminal box is usually electrically live, it is dangerous to hold a bus bar when installing the bus bar. However, in common practices, operators connect a terminal box to a circuit breaker when the terminal box is being supplied with power, i.e. without shutting off the terminal box, for the reasons that it is convenient and simple to operate on connection of the bus bar to the terminal box and the circuit breaker.

Since a metallic connection portion of the bus bar which connects the terminal box and the circuit breaker to each other appears on the outside and thus is contactable after the bus bar is installed. Therefore, there is always risk of short circuiting or electrical shock attributable to changes in surrounding conditions or unexpected accidents.

In order to prevent this, generally an external casing of a terminal box is locked using a lock. Even in this case, the problem that the metallic connection portion is not sealed and insulated within the external casing, is not addressed.

On the other hand, a conventional bus bar functions only as a connection medium to connect power terminals, and it is difficult to use the conventional bus bar for other purposes.

Typically, power lines connected to a terminal box have four lines for four phases of power including a neutral phase. On the other hand, with respect to loads connected to a circuit breaker, there are various types of loads, such as loads using two phases of power and loads using three phases of power. And in terms of the quality of loads connected to each phase of power, the conventional bus bar cannot confirm the differences between the phases of power in phase of reactive power, according to loads such as a load including many inductive components and a load including many capacitive components.

In order to monitor use of power within a terminal box or a circuit breaker, an apparatus in which a power monitoring device is built in a terminal box or a circuit breaker has been already developed. This technology has a problem that an existing terminal box or circuit breaker has to be replaced with this apparatus, resulting in burdensome costs and effort.

DISCLOSURE

Technical Problem

Accordingly, the present invention has been made keeping in mind the above problems occurring in the prior art, and an object of the present invention is to provide a module type safety bus bar having the following advantages: (a) it provides an insulating handle to facilitate safe and convenient connection work when connecting a terminal box and a circuit breaker to each other; (b) it eliminates safety issues, which may arise in connection with conventional bus bars after the connection work is completed, by covering a portion of the bus bar which appears on the outside after the connection work is completed; and (c) it acquires information on use of each phase of power which is connected, for later use.

Another object of the invention is to provide a module type safety bus bar that can provide useful information for improvement of power quality by finding either a power line which causes excessive reactive power or a phase of power which is excessively consumed and by connecting loads in a manner so as to increase consumption of real power or to decrease the phase of reactive power.

Technical Solution

In order to accomplish the above objects, according to one aspect, there is provided a module type safety bus bar including: a vertical coupling portion which is a vertically-extending rectangular parallelepiped insulating block, has an upper end provided with a first combining means, and has a middle portion into which a bus bar penetrates to be combined with the vertical coupling portion in the form of a cross, the bus bar connecting a terminal for one phase of power of a distributor and a terminal for one phase of power of a circuit breaker; and a horizontal coupling portion which is a horizontally-extending rectangular parallelepiped insulating block and has a second combining means, which is to be combined with the first combining means of the vertical coupling portion, in a middle portion of a lower end thereof, wherein the distributor and the circuit breaker are safely connected to each other by allowing an operator to hold the vertical coupling portion, and a metallic connection portion of the bus bar is covered by the horizontal coupling portion so as to be safe after the bus bar is connected.

A sensor module portion which senses electrical information flowing to the bus bar is mounted inside the vertical coupling portion; a connector which transmits a sensed signal of the sensor module portion is disposed in an upper end portion of the vertical coupling portion; a sensor connecting terminal, to be connected to the connector of the vertical coupling portion, is disposed in a middle portion of the lower end of the horizontal coupling portion so that the horizontal coupling portion can be assembled with the vertical coupling portion; a PCB, on which a measurement circuit portion to process the sensed signal of the sensor module portion is formed, is disposed in the horizontal coupling portion; and electrical information of terminals for each phase of power which are connected to each other may be detected when the terminals of the distributor and the circuit breaker are connected.

The measurement circuit portion may include: a transmitter circuit portion which receives and transmits a signal of the sensor connecting terminal of the horizontal coupling portion; and a main circuit portion which interprets the signal transmitted by the transmitter circuit portion.

The transmitter circuit portion may additionally have a function of receiving and transmitting a signal transmitted from a neighboring transmitter circuit portion.

The transmitter circuit portion and the main circuit portion may be formed in respective PCBs to form a transmitter circuit board and a main circuit board, respectively; and the transmitter circuit board and the main circuit board may be separately mounted inside the horizontal coupling portion.

The module type safety bus bar may include: a master bus bar which is mounted together with the transmitter circuit board and the main circuit board in one horizontal coupling portion; and slave bus bars, each of which is mounted together with the transmitter circuit board in one horizontal coupling portion, wherein the master bus bar is connected to a terminal for one phase of power among three or four phases of power of the circuit breaker and the slave bus bars are connected to terminals for the other phases of power, wherein the transmitter circuit board for the master bus bar and the transmitter circuit boards for the slave bus bars are connected to each other via a flat cable, and wherein a sensed signal for each power phase of the circuit breaker is independently detected, and the detected signals of the respective power phases are collectively processed in the master bus bar.

The module type safety bus bar may include a master bus bar, which is mounted together with both of the transmitter circuit board and the main circuit board in one horizontal coupling portion, and a slave bus bar which is mounted together only with the transmitter circuit board in one horizontal coupling portion. The transmitter circuit board may include a near field wireless communication circuit and a unique code is embedded in each module type safety bus bar so that electrical information of the module type safety bus bar which is arranged in parallel with the circuit breaker is wirelessly transmitted to the master bus bar.

The horizontal coupling portion is structured such that: an upper portion thereof takes the form of an openable cover; an inside space thereof is provided with a slot into which a PCB is to be mounted; and the main circuit board or the transmitter circuit board is inserted into the slot after the cover is opened.

The horizontal coupling portion may have recessed portions at upper ends of respective side plates, forming slot-like holes when the cover is closed so that flat cables can pass through the slot-like holes. The horizontal coupling portion may have a front cover whose boundary is cut in the form of a chain cut line, in a front panel so that the front cover is easily removable. The front cover is removed to form an external line connector when the main circuit board is inserted so that the main circuit board can be connected to an external line by the external line connector.

The vertical coupling portion can be divided in a longitudinal direction and then reassembled, have a bus bar-combining hole, through which the bus bar is inserted to be combined with the vertical coupling portion, in a middle portion thereof, and have an inside space in which the sensor module portion is mounted.

The sensor module portion may have a rectangular parallelepiped shape; the sensor module portion may include a bus bar-passing through-hole, through which the bus bar is inserted, in a side portion thereof, and a sensor fixing cylinder, which fixes a sensor, prevents electrical disturbance, and communicates with the bus bar-passing through hole, in an upper portion thereof; and the sensor module portion includes a metal piece which extends to the bus bar-passing through-hole so as to come into contact with the bus bar when the bus bar is inserted into the bus bar-passing through-hole, thereby detecting voltage information.

In the bus bar, a side surface of a middle portion of the bus bar has a protrusion which protrudes from the side surface thereof so that the middle portion has a larger width then the other portions thereof and so that the bus bar does not easily separate from the vertical coupling portion after a series of operations are performed that the vertical coupling portion is disassembled, the bus bar is inserted into the bus bar-combining hole, and the vertical coupling portion is reassembled.

A sensor installed in the sensor module portion may collect electrical information flowing to the bus bar in a contactless manner and interpret information on power by using a hall sensor or a Rogowskii coil.

The sensor module portion may be a sensor which detects any one of current, temperature, and voltage.

According to another aspect, there is provided a module type safety bus bar including: a vertical coupling portion which is a vertically-extending rectangular parallelepiped insulating block and has a middle portion into which a bus bar penetrates to be combined with the vertical coupling portion in the form of a cross, the bus bar connecting a terminal for one phase of power of a distributor to a terminal for one phase of power of a circuit breaker, wherein the terminals of the distributor and the circuit breaker are safely connected to each other by allowing the vertical coupling portion to be used as an insulating handle portion when connecting the terminals of the distributor and the circuit breaker to each other.

The module type safety bus bar may further include a horizontal coupling portion, an inside of which is provided with a sensor module portion and a PCB on which a measurement circuit portion is formed, the sensor module portion sensing electrical information flowing to an inside of the vertical coupling portion, the measurement circuit portion processing a signal output from the sensor module portion, wherein the module type safety bus bar obtains electrical information of the terminals for one phase of power which are connected to each other when connecting the terminals of the distributor and the circuit breaker to each other.

Advantageous Effects

The module type safety bus bar according to the present invention has advantages of: providing an insulating handle to facilitate safe and convenient connection work when connecting a terminal box and a circuit breaker to each other using a bus bar; eliminating safety issues, which may arise in connection with conventional bus bars after connection work is completed, by covering a portion of the bus bar which appears on the outside after the connection work is completed; and acquiring information on use of each phase of power which is connected for later use.

Additionally, the module type safety bus bar according to the present invention has an advantage of providing useful information for improvement of power quality by finding either a power line which causes excessive reactive power or a phase of power which is excessively consumed, and by connecting loads in such a manner so as to increase consumption of real power or decrease the phase of reactive power.

BEST MODE

Hereinafter, the present invention will be described with reference to the accompanying drawings, and a description about known or related technologies or constructions will be omitted in describing the present invention when there is a possibility that it obscures the gist of the present invention.

The terms described below are terms defined in consideration of substantial functions as used in the present invention. Since definitions of the terms may vary depending on user's intention and customs, definitions of the terms should be understood referring to the entire content of the specification of the present application.

Figure 1:
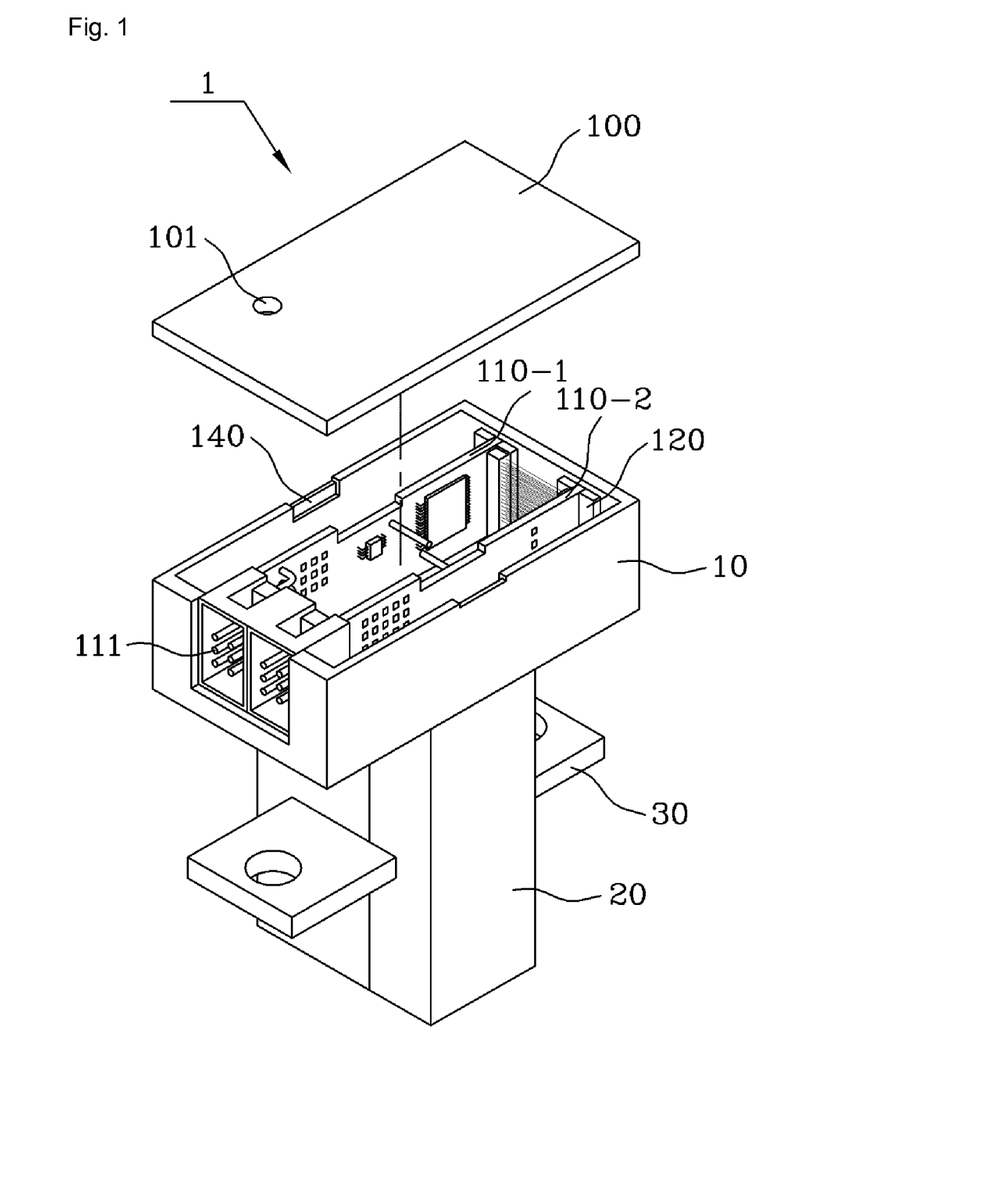
FIG. 1 is a perspective view illustrating a master bus bar which is not covered by a cover, according to the present invention.
Figure 2:
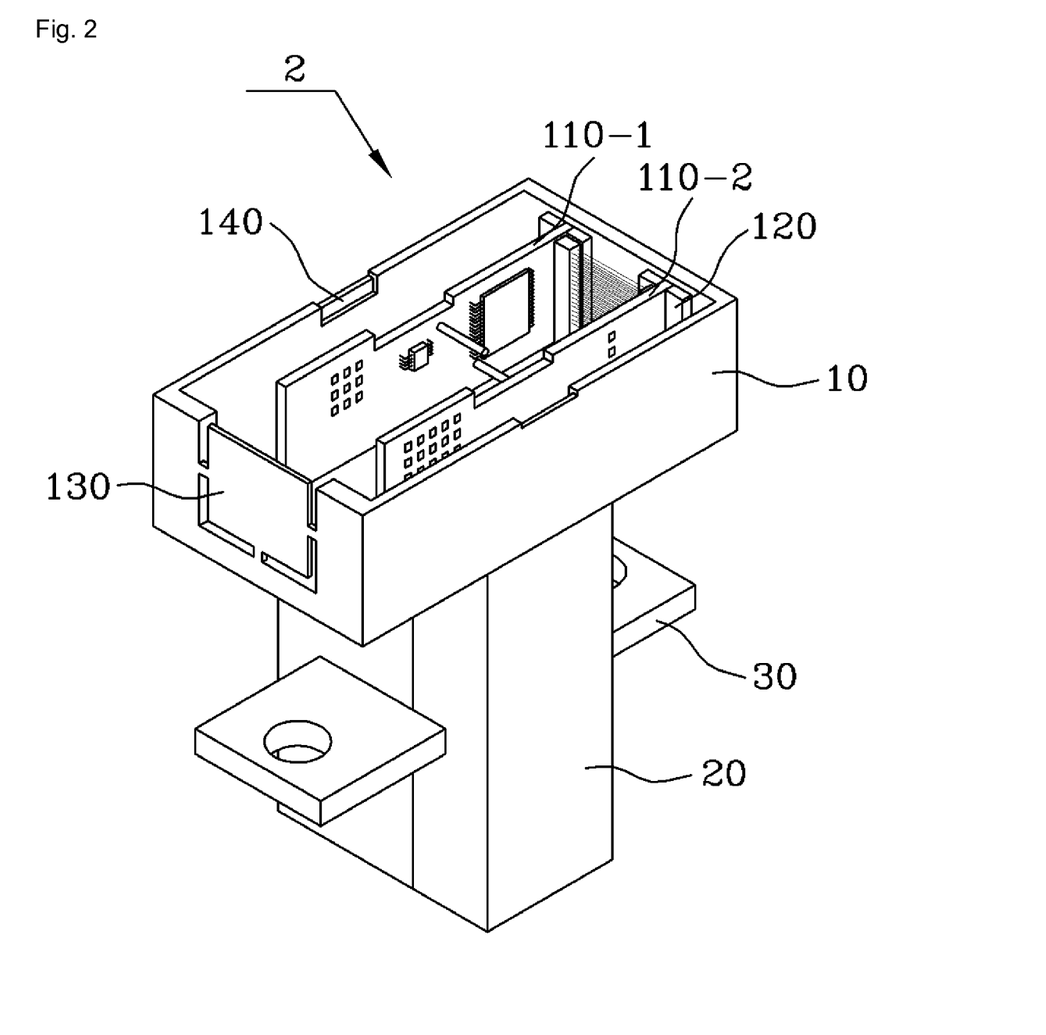
FIG. 2 is a perspective view illustrating a slave bus bar according to the present invention.
Figure 3:
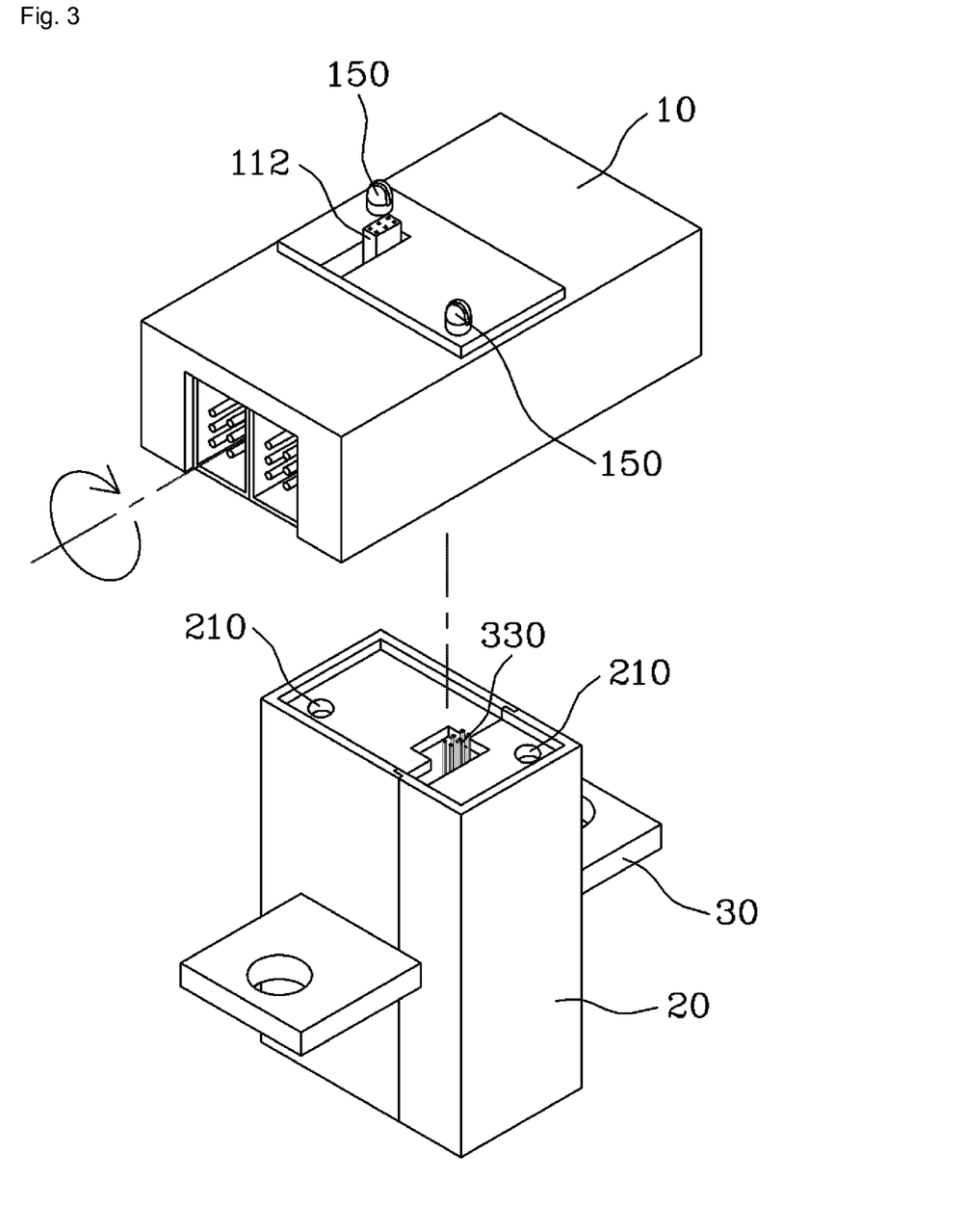
FIG. 3 is an exploded perspective view illustrating a vertical coupling portion and a horizontal coupling portion according to the present invention.
Figure 4:
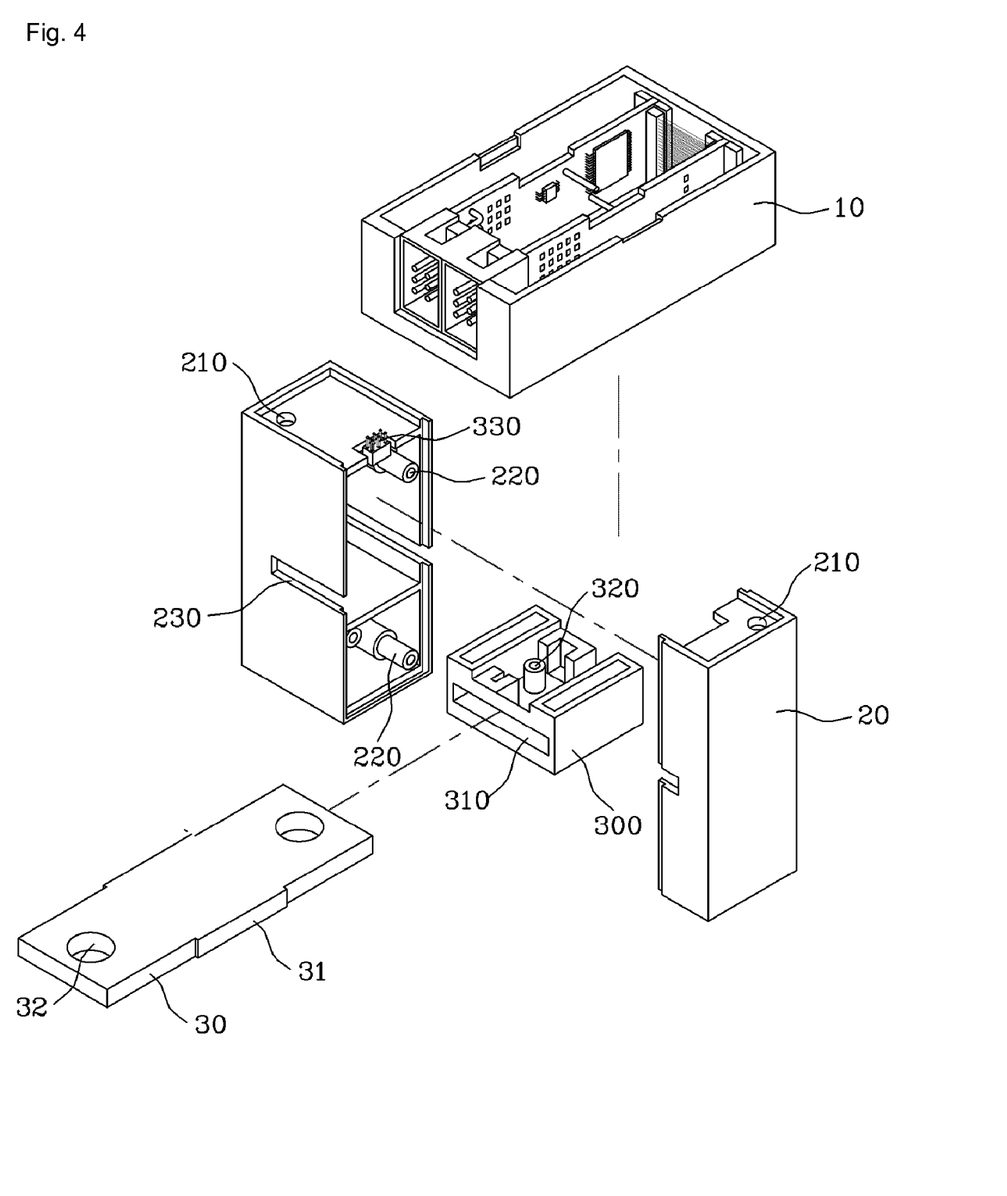
FIG. 4 is an exploded perspective view illustrating the entire structure of the present invention.
Figure 5:
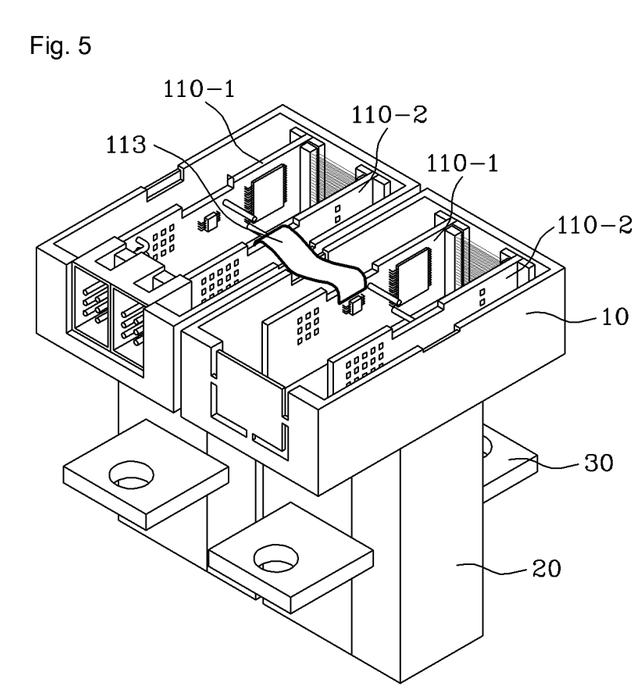
FIG. 5 is a perspective view illustrating the master bus bar and the slave bus bar which are arranged in parallel with each other.
Figure 6:
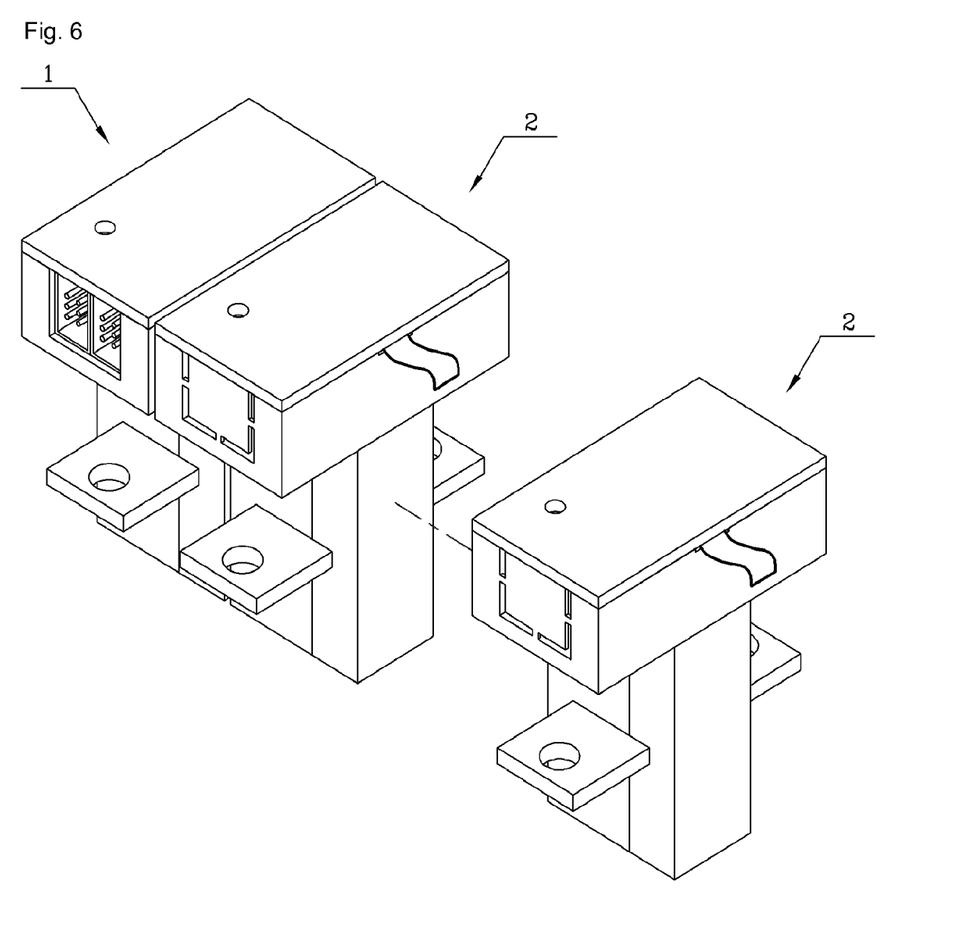
FIG. 6 is a perspective view illustrating an embodiment in which the module type safety bus bars according to the present invention are actually connected to each other.
Figure 7:
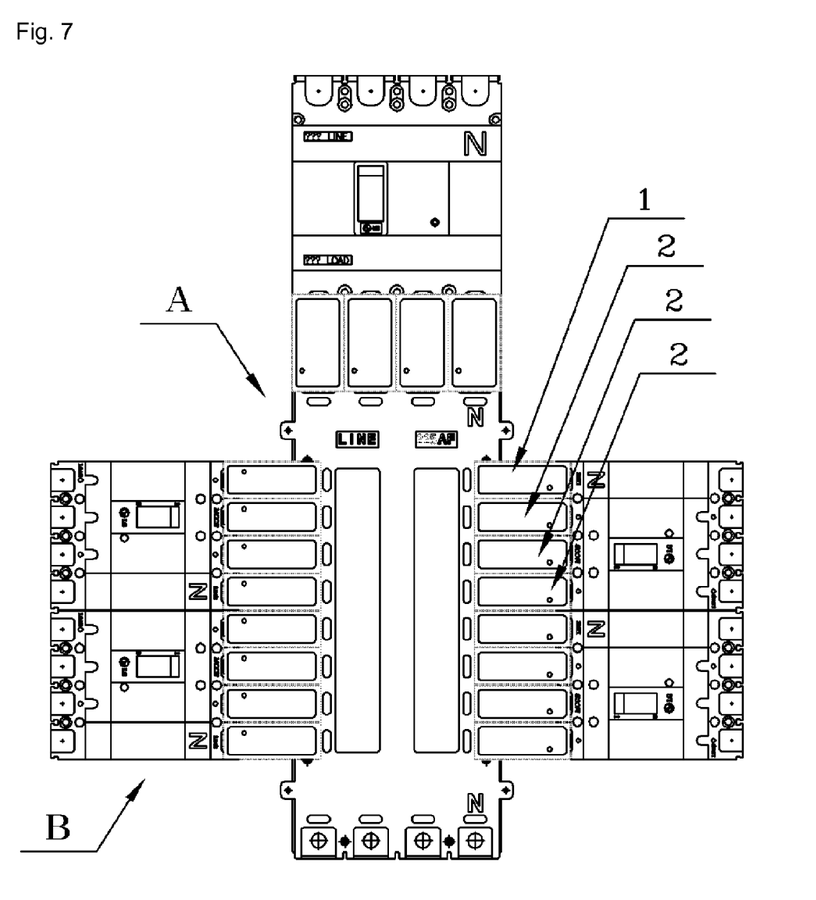
FIG. 7 is a plan view illustrating an example in which the present invention is applied to a distributor and a circuit breaker.
Figure 8:
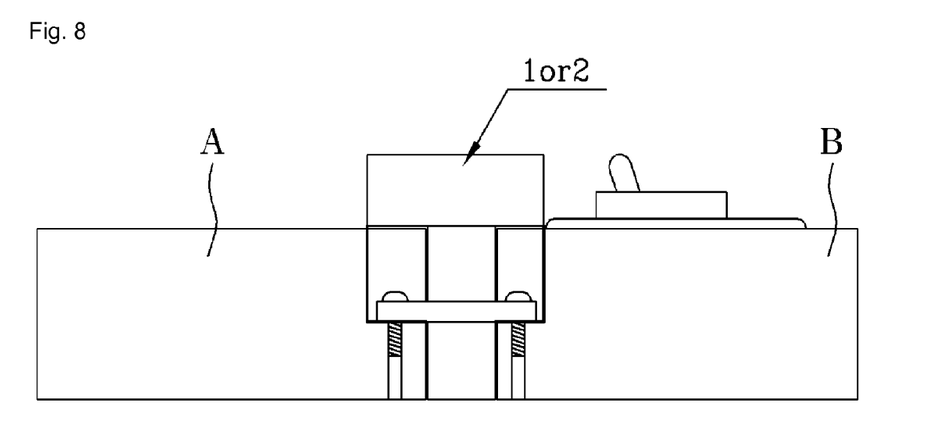
FIG. 8 is a side view illustrating the example in which the present invention is applied to the distributor and the circuit breaker.
Figure 9:
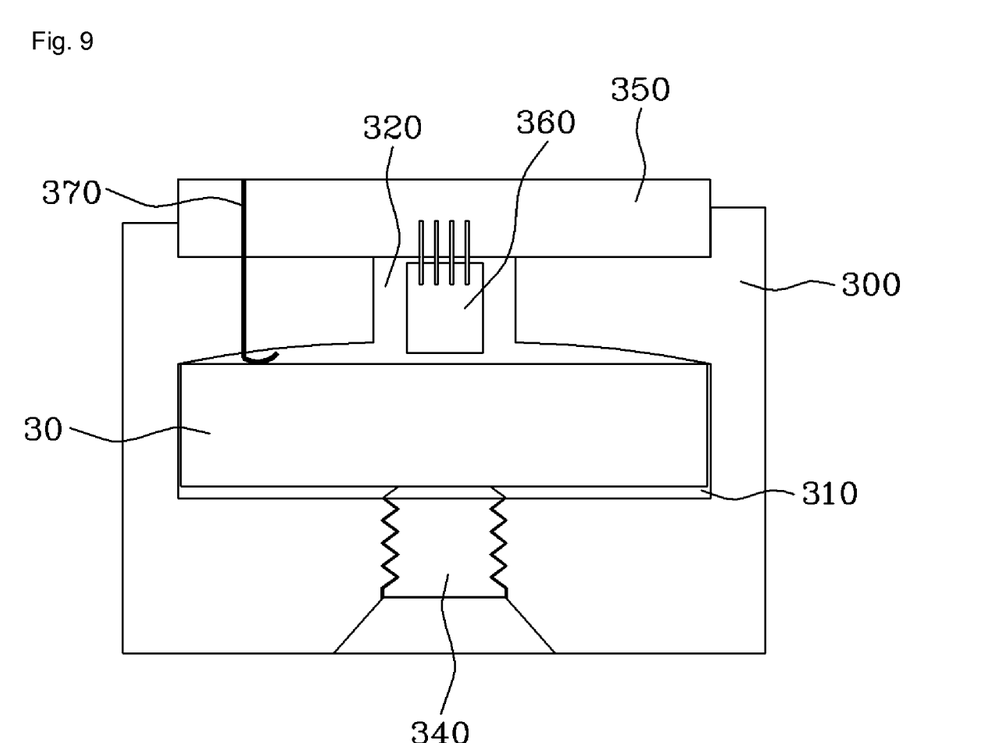
FIG. 9 is a view illustrating a cross-sectional structure of a sensor module portion according to the present invention.

FIG. 1 is a perspective view illustrating a master bus bar which is not covered by a cover, according to the present invention; FIG. 2 is a perspective view illustrating a slave bus bar according to the present invention; FIG. 3 is an exploded perspective view illustrating a vertical coupling portion and a horizontal coupling portion according to the present invention; FIG. 4 is an exploded perspective view illustrating the entire structure of the present invention; FIG. 5 is a perspective view illustrating the master bus bar and the slave bus bar which are arranged in parallel with each other; FIG. 6 is a perspective view illustrating an embodiment in which the module type safety bus bars according to the present invention are actually connected to each other; FIG. 7 is a plan view illustrating an example in which the present invention is applied to a distributor and a circuit breaker; FIG. 8 is a side view illustrating the example in which the present invention is applied to the distributor and the circuit breaker; and FIG. 9 is a view illustrating a cross-sectional structure of a sensor module portion according to the present invention.

As illustrated in the drawings, the present invention relates to a bus bar which connects a distributor A and a circuit breaker B in a phase-to-phase connection manner. The bus bar roughly includes a bus bar 30, a sensor module portion 300, a vertical coupling portion 20, and a horizontal coupling portion 10.

As illustrated in FIGS. 3 and 4, the vertical coupling portion 20 is a vertically-extending rectangular parallelepiped insulating block. The bus bar 30 which connects a terminal for one phase of power of the distributor A and a terminal for one phase of power of the circuit breaker B to each other is combined with the vertical coupling portion 20, forming a resultant cross shape, by orthogonally penetrating a middle portion of the vertical coupling portion 20. The sensor module portion 300 which senses electrical information flowing to the bus bar 30 is disposed inside the vertical coupling portion 20, and an upper end portion of the vertical coupling portion 20 is provided with a connector 330 which transmits a sensed signal of the sensor module portion 300.

Since the vertical coupling portion 20 is a vertically-extending insulating block, it primarily functions as a handle for the bus bar 30 when the distributor A is connected to the circuit breaker B via the bus bar.

As illustrated in FIG. 4, the sensor module portion 300 is disposed inside the vertical coupling portion 20. For this reason, the vertical coupling portion 20 needs to secure a space to accommodate the sensor module portion 300 therein.

As illustrated in FIG. 4, preferably the vertical coupling portion 20 is an assembled body which can be vertically divided into left and right half-bodies so that the sensor module portion 300 can be easily mounted and the bus bar 30 can be easily combined with the vertical coupling portion.

A middle portion of the vertical coupling portion 20, which can be divided into the left and right half-bodies, is provided with a bus bar combining hole 230 used to combine the vertical coupling portion and the bus bar 30. The vertical coupling portion 20 has an inside space for accommodating the sensor module portion 300 therein.

The upper end of the vertical coupling portion 20 is provided with the connector 330 which is connected to the horizontal coupling portion 10 and which transfers an electrical signal of the sensor module portion 300.

The sensor module portion 300 has a rectangular parallelepiped shape and is accommodated in the inside space of the vertical coupling portion 20. In addition, as illustrated in FIGS. 4 and 9, the sensor module portion 300 has a bus bar-passing through-hole 310, through which the bus bar 30 is inserted, in a middle portion thereof and a fixing cylinder 320, which is used to fix a sensor, at an upper end portion thereof.

The sensor module portion 300 includes at least one sensor which senses current, temperature, or voltage of the bus bar 30 which is inserted through the bus bar-passing through-hole thereof.

The sensor 360 may be formed using a hall sensor or a Rogowskii coil which detects current, so that electrical information flowing to the bus bar 30 is collected in a contactless manner and information on power can be interpreted.

To this end, the hall sensor or Rogowskii coil needs to be fixed in a contactless manner in such a short distance that information on magnetic field of the bus bar 30 can be acquired.

In addition, the information on the magnetic field generated by the bus bar 30 needs to be acquired by the sensor, without being influenced by disturbance.

The sensor fixing cylinder 320 is provided for this purpose. The sensor fixing cylinder 320 is connected to communicate with the bus bar-passing through-hole 310, fixes the hall sensor or Rogowskii coil to the bus bar 30 in a contactless manner, and prevents disturbance from intervening information of magnetic field.

In addition, the sensor module portion 300 includes a metal piece 370 which comes into contact with the bus bar 30 and detects voltage information when the bus bar 30 is inserted in the bus bar-passing through-hole 310.

Ways of using the voltage information detected via the metal piece will be described later.

The sensor module portion 300 may further include various sensors such as a temperature sensor, depending on the purpose of the design.

As shown in the cross-sectional structure of the sensor module portion illustrated in FIG. 9, preferably the sensor 360 and the metal piece 370 are connected to a sensor board 350. In order to fix the bus bar 30, bolts 340 are screwed from the underside of the sensor module portion.

The bus bar 30 and the vertical coupling portion 20 are easily combined with each other because the vertical coupling portion 20 can be disassembled into left and right half-bodies and the bus bar 30 is inserted after the vertical coupling portion 20 is disassembled. When the left and right half-bodies are assembled to form the vertical coupling portion 20, the vertical coupling portion has a container shape.

The bus bar 30 has a bulging 31 in a midway position in terms of a longitudinal direction thereof. The bulging portion 31 has a larger width than the other portions thereof, so that the bus bar 30 is not easily separated from the vertical coupling portion 20 once the vertical coupling portion 20 is assembled.

In addition, the bus bar has screw holes 32 at respective ends for the purpose of connection to power terminals like conventional bus bars.

As illustrated in FIGS. 1 to 4, the horizontal coupling portion 10 is a horizontally-extending rectangular parallelepiped insulating block. As illustrated in FIG. 3, a sensor connecting terminal 112 to be connected to the connector 330 of the vertical coupling portion 20 is disposed in a middle portion of a lower end of the horizontal coupling portion 10, enabling connection between the horizontal coupling portion 10 and the vertical coupling portion 20. A Printed Circuit Board (PCB) which processes a signal of the sensor module portion 300 is mounted within the horizontal coupling portion 10.

When combining the bus bar 30 with an assembled structure of the vertical coupling portion 20 and the horizontal coupling portion 10, the vertical coupling portion 20 functions as a handle. On the other hand, after the bus bar 30 is combined with the assembled structure of the vertical coupling portion 20 and the horizontal coupling portion 10, the horizontal coupling portion 10 functions as a cover to cover the bus bar 30 so that a metallic portion of the bus bar 30 will not appear on the outside.

In order to firmly combine the vertical coupling portion 20 and the horizontal coupling portion 10 with each other, a combining means is provided in a contact portion between the vertical coupling portion 20 and the horizontal coupling portion 10.

An upper end portion of the vertical coupling portion 20 and a lower end portion of the horizontal coupling portion 10 are provided with a first combining means 210 and a second combining means 150, respectively, as shown in FIG. 3. (FIG. 3 is a perspective view illustrating the upside down structure of the horizontal coupling portion 10 and shows the lower end of the horizontal coupling portion 10. The first combining means and the second combining means are exemplary combining means that can be combined with each other. Accordingly, all known combining means can be used as long as they can accomplish the purpose of the first and second combining means.)

The second combining means 210 may be a hole and the first combining means 150 may be a protrusion that can be press-fitted into the hole, or vice versa.

The overall shape of the entire assembled structure is determined according to the position of the combining means within the lower end of the horizontal coupling portion 10. When the combining means is formed in a middle portion of the lower end of the horizontal coupling portion 10, the assembled structure of the vertical coupling portion 20 and the horizontal coupling portion 10 is T-shaped so that respective sides of the metallic portion of the bus bar 30 can be equally covered by the horizontal coupling portion 10.

A PCB of a circuit portion mounted inside the horizontal coupling portion 10 is connected to the sensor connecting terminal 112, forming a measurement circuit portion which interprets a signal of the sensor.

Accordingly, according to the present invention having the construction described above, when connecting an external power input line to the circuit breaker B via the distributor A, since the vertical coupling portion 20 which is an insulating block functions as a handle portion, it is easy to connect the power line. In addition, the horizontal coupling portion 10 has advantages of protecting a connected portion of the power line as illustrated in FIG. 8 and of acquiring information on power of a terminal for each phase of power which is connected by the bus bar.

As illustrated in FIGS. 1 and 2, the horizontal coupling portion 10 is structured such that an upper portion thereof takes the form of an openable cover 100. In addition, a slot 120 in which the PCB is inserted is disposed inside the horizontal coupling portion 10. Accordingly, this construction enables easy assembling and maintenance for the horizontal coupling portion 10.

The measurement circuit portion includes a transmitter circuit portion which receives and transmits a signal of the sensor connecting terminal of the horizontal coupling portion 10 and a main circuit portion which interprets the signal transmitted from the transmitter circuit portion. The transmitter circuit portion and the main circuit portion are formed in respective circuit boards, i.e. a transmitter circuit board 110-2 and a main circuit board 110-1, respectively, and inserted into the slots 120 disposed within the horizontal coupling portion 10.

In the distributor A and the circuit breaker B, the external power input line typically includes three or four phase lines including a neutral line. Accordingly, the terminal portion for connection is made up of terminals for three or four phases of power.

Since the bus bar 30 according to the present invention is used to connect a single phase of power, a total of three or four bus bars 30 are connected to one circuit breaker B.

When the bus bars 30 are arranged in parallel with the circuit breaker B as illustrated in FIGS. 6 and 7, information on each phase of power can be independently detected.

According to the present invention, for facilitation of circuit configuration and acquisition of information on each phase of power, the bus bars are used as a master bus bar 1 and a plurality of slave bus bars 2.

The master bus bar 1 is a bus bar which is mounted in the horizontal coupling portion in which both of the transmitter circuit board 110-2 and the main circuit board 110-1 are mounted. The slave bus bar 2 is a bus bar which is mounted in the horizontal coupling portion 10 in which only the transmitter circuit board 110-2 is mounted.

The main circuit board 110-1 for the master bus bar performs operation on sensed information which is input through the transmitter circuit board 110-2 and outputs its operation result, and the transmitter circuit board 110-2 is configured to transmit sensed information of the sensor module portion 300 and information of a neighboring transmitter circuit board 110-2 to the main circuit board 110-1.

In the present invention, a terminal for one phase of power of a three-phase or four-phase circuit breaker is connected to the master bus bar 10 and terminals for the other phases of power are connected to the slave bus bars 2.

The transmitter circuit boards 110-2 for the master bus bar 1 and the slave bus bars 2 are connected to each other by a flat cable or by a wireless network so that sensor signals of respective phases of power of one circuit breaker B can be independently detected and the detected signals of the respective phases of power are collectively processed by the master bus bar 1.

This collective processing produces voltage information of the circuit breaker B. The metal piece 370 of the sensor module portion 300 comes into contact with the bus bar 30 and acquires electrical information of the bus bar 30. Since the metal piece 370 is electrically connected to the connector 330 via the sensor connecting terminal 112 and the transmitter circuit board 110-2, it is transmitted to the main circuit board 110-1.

In the main circuit board 110-1, the electrical information of the metal piece 370 for each phase of power is compared with that for another phase of power and an inter-phase voltage is calculated.

The inter-phase voltage is compared with the amount of current measured for one phase of power to calculate the amount of electric power use, and thus a ratio between reactive power and real power can be obtained from the inter-phase voltage.

Recessed portions 140 are formed in middle portions of upper ends of side plates of the horizontal coupling portion in order to allow the flat cable 113 to pass therethrough when the upper cover 100 is closed. A front cover 130 is provided in a front panel of the horizontal coupling portion. The boundary of the front cover 130 is cut in the form of a chain cut line so that the front cover 130 can be easily removed when the main circuit board 110-1 is inserted, thereby forming an external line connector by which the main circuit board 110-1 is connected to the external line, in a position where the front cover 130 has existed.

The structure of the horizontal coupling portion 10 has an advantage of saving costs for molds by employing a general-purpose casing which can be used for all of the master bus bar 1 and the slave bus bars 2.

When the transmitter circuit board 110-2 is connected in a wired manner by the flat cable 113, as illustrated in FIG. 5, the flat cable 113 can be connected by passing through the slot-like hole formed by the recessed portion 14.

In this case, since the bus bar according to the present invention is in contact or in tight contact with the circuit breaker, the flat cable 113 is unlikely to appear on the outside as illustrated in FIG. 6.

When the transmitter circuit board 110-2 includes a near field communication circuit portion and transmits a signal in a wireless manner, and when each module type safety bus bar has a unique code embedded therein, electrical information of the slave bus bars 2 which are arranged in parallel with one circuit breaker B or one distributor may be wirelessly transmitted to the master bus bar 1.

In this case, the master bus bar 1 may be installed on the only one terminal of the distributor and the slave bus bars 2 may be installed on the other terminals of the distributor.

According to the present invention, it is possible to check the state of use of inter-phase power of the circuit breaker B, a power line which causes an imbalance between phases can be found.

That is, since it is possible to select a power input line of a load which is connected to another circuit breaker by finding the power line at which excessive reactive power occurs or the phase which is excessively consumed, it is possible to improve power quality by connecting a power line to loads in a manner so as to increase the amount of consumption of real power or to decrease the phase of reactive power.

The cover of the horizontal coupling portion 10 is provided with a display portion so that a user can check the state of use of the bus bar 30.

The display portion is provided in the following manner: an LED is installed on the main circuit board 110-1 or the transmitter circuit board 110-2 so as to face up; the cover 100 of the horizontal coupling portion 10 is provided with a through-hole 101 immediately above the LED; and the driving state of the LED can be checked from the outside. Alternatively, the display portion may have a display window which displays more detailed information than the one which is described above.

Alternatively, among the elements of the structure described above, the present invention may include only the vertical coupling portion, and all the technological effects described above can be obtained by the vertical coupling portion.

That is, even though the structure according to the present invention includes only the vertical coupling portion which is a vertically-extending rectangular parallelepiped insulating block and has the middle portion through which the bus bar, which connects a terminal for one phase of power of a circuit breaker and a terminal for one phase of power of a distributor, orthogonally penetrates to be combined with the vertical coupling portion in the form of a cross, since an operator can safely connect the distributor and the circuit breaker to each other while holding the vertical coupling portion, the functional object of the present invention can be accomplished.

In this case, by including the horizontal coupling portion in which the sensor module portion and the PCB are inserted, wherein the sensor module portion senses electrical information flowing to the bus bar and the PCB has thereon the measurement circuit portion which processes a signal of the sensor module portion; it is possible to detect an electrical signal of one phase of power which is connected when connecting the terminals of the distributor and the circuit breaker to each other.

The accompanying drawings illustrate embodiment into which the present invention is specifically embodied for the purpose of aiding in understanding of the present invention, and those skill in the art will appreciate that various combinations of the embodiments are possible to realize the gist of the present invention.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A module type safety bus bar, comprising:
a vertical coupling portion which is a vertically-extending rectangular parallelepiped insulating block, has an upper end provided with a first combining means, and has a middle portion into which a bus bar penetrates to be combined with the vertical coupling portion in the form of a cross shape, wherein the bus bar connects a terminal for one phase of power of a distributor and a terminal for one phase of power of a circuit breaker to each other, and wherein the bus bar extends from either side of the vertical coupling portion; and
a horizontal coupling portion which is a horizontally-extending rectangular parallelepiped insulating block and has a second combining means located in a middle portion of a lower end of the horizontal coupling portion, wherein the second combining means is to be combined with the first combining means of the vertical coupling portion, and wherein the horizontal coupling portion extends substantially a same length of the bus bar;
wherein the distributor and the circuit breaker are safely connected to each other by using the vertical coupling portion as an insulating handle, and wherein a metallic connection portion of the bus bar is covered by the horizontal coupling portion to be in a safe state after the bus bar is connected.

2. The module type safety bus bar according to claim 1, wherein the vertical coupling portion is structured in a manner such that a sensor module portion which senses electrical information flowing to the bus bar is mounted inside the vertical coupling portion, and that a connector which transmits a sensed signal of the sensor module portion is disposed in the upper end of the vertical coupling portion;
wherein the horizontal coupling portion is structured in a manner such that a sensor connecting terminal to be connected to the connector of the vertical coupling portion is disposed in a middle portion of the lower end of the horizontal coupling portion so that the horizontal coupling portion is assembled with the vertical coupling portion and such that a PCB, on which a measurement circuit portion to process the sensed signal of the sensor module portion is formed, is inserted in the horizontal coupling portion; and
wherein electrical information of terminals for one phase of power is detected when the terminals of the distributor and the circuit breaker are connected to each other.

3. The module type safety bus bar according to claim 2, wherein the measurement circuit portion includes:
a transmitter circuit portion which receives and transmits a signal of the sensor connecting terminal of the horizontal coupling portion; and
a main circuit portion which interprets the signal transmitted by the transmitter circuit portion.

4. The module type safety bus bar according to claim 3, wherein the transmitter circuit portion additionally has a function of receiving and transmitting a signal transmitted from a neighboring transmitter circuit portion.

5. The module type safety bus bar according to claim 4, wherein the transmitter circuit portion and the main circuit portion are formed in respective PCBs to form a transmitter circuit board, and wherein a main circuit board and the transmitter circuit board and the main circuit board are separately mounted inside the horizontal coupling portion.

6. The module type safety bus bar according to claim 5, wherein a plurality of the module type safety bus bars are used as a master bus bar which is mounted together with the transmitter circuit board and the main circuit board in one horizontal coupling portion and as slave bus bars, each of which is mounted together with the transmitter circuit board in one horizontal coupling portion,
wherein the master bus bar is connected to a terminal for one phase of power among three or four phases of power of the circuit breaker and the slave bus bars are connected to terminals for the other phases of power,
wherein the transmitter circuit board of the master bus bar and the transmitter circuit boards of the slave bus bars are connected to each other via a flat cable, and
wherein a sensed signal for each phase of power of the circuit breaker is independently detected, and detected signals of the respective phases of power are collectively processed in the master bus bar.

7. The module type safety bus bar according to claim 5, wherein a plurality of the module type safety bus bars is used as a master bus bar which is mounted together with the transmitter circuit board and the main circuit board in one horizontal coupling portion, and slave bus bars, each of which is mounted together with the transmitter circuit board in one horizontal coupling portion, and
wherein the transmitter circuit board includes a near field wireless communication circuit portion and a unique code is embedded in each module type safety bus bar, so that electrical information of the module type safety bus bar which is arranged in parallel with the circuit breaker is wirelessly transmitted to the bus bar.

8. The module type safety bus bar according to claim 6, wherein the horizontal coupling portion is structured such that an upper portion thereof takes the form of an openable cover and that an inside space thereof is provided with a slot into which a PCB is mounted, and
wherein the main circuit board or the transmitter circuit board is inserted into the slot after the cover is opened.

9. The module type safety bus bar according to claim 8, wherein the horizontal coupling portion has recessed portions at upper ends of respective side plates, forming slot-like holes when the cover is closed so that flat cables pass through the slot-like holes,
wherein the horizontal coupling portion has a front cover whose boundary is cut in the form of a chain cut line, in a front panel, so that the front cover is easily removable, and
wherein, when the main circuit board is inserted, the front cover is removed to form an external line connector so that the main circuit board is connected to an external line by the external line connector.

10. The module type safety bus bar according to claim 2, wherein the vertical coupling portion is divided in a longitudinal direction and reassembled, has a bus bar-combining hole, into which the bus bar is inserted to be combined with the vertical coupling portion, in a middle portion thereof, and has an inside space in which the sensor module portion is mounted.

11. The module type safety bus bar according to claim 10, wherein the sensor module portion has a rectangular parallelepiped shape, wherein the sensor module portion includes: a bus bar-passing through-hole, into which the bus bar is inserted, in a side portion thereof; and a sensor fixing cylinder, which fixes a sensor, prevents electrical disturbance, and communicates with the bus bar-passing through hole, in an upper portion thereof, and wherein the sensor module portion includes a metal piece which extends to the bus bar-passing through-hole so as to come into contact with the bus bar when the bus bar is inserted into the bus bar-passing through-hole, thereby detecting voltage information.

12. The module type safety bus bar according to claim 10, wherein in the bus bar, a side surface of a middle portion thereof has a protrusion which protrudes from the side surface so that the middle portion has a larger width then the other portions thereof and thus the bus bar does not easily separate from the vertical coupling portion after a series of operations are performed that the vertical coupling portion is disassembled, the bus bar is inserted into the bus bar-combining hole, and the vertical coupling portion is reassembled.

13. The module type safety bus bar according to claim 11, wherein a sensor installed in the sensor module portion collects electrical information flowing to the bus bar in a contactless manner and interprets information on power by using a hall sensor or a Rogowskii coil.

14. The module type safety bus bar according to claim 11, wherein the sensor module portion is a sensor which detects any one of current, temperature, and voltage.

15. The module type safety bus bar according to claim 7, wherein the horizontal coupling portion is structured such that an upper portion thereof takes the form of an openable cover and that an inside space thereof is provided with a slot into which a PCB is mounted, and wherein the main circuit board or the transmitter circuit board is inserted into the slot after the cover is opened.

16. The module type safety bus bar according to claim 15, wherein the horizontal coupling portion has recessed portions at upper ends of respective side plates, forming slot-like holes when the cover is closed so that flat cables pass through the slot-like holes, wherein the horizontal coupling portion has a front cover whose boundary is cut in the form of a chain cut line, in a front panel, so that the front cover is easily removable, and wherein, when the main circuit board is inserted, the front cover is removed to form an external line connector so that the main circuit board is connected to an external line by the external line connector.

* * * * *